(12) United States Patent
Nishihara et al.

(10) Patent No.: US 11,315,839 B2
(45) Date of Patent: Apr. 26, 2022

(54) EVALUATION METHOD AND MANUFACTURING METHOD OF SIC EPITAXIAL WAFER

(71) Applicant: SHOWA DENKO K.K., Tokyo (JP)

(72) Inventors: Yoshitaka Nishihara, Chichibu (JP); Koji Kamei, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/207,396

(22) Filed: Dec. 3, 2018

(65) Prior Publication Data
US 2019/0172758 A1    Jun. 6, 2019

(30) Foreign Application Priority Data
Dec. 6, 2017  (JP) ............. JP2017-234586

(51) Int. Cl.
*H01L 21/02* (2006.01)
*H01L 21/66* (2006.01)
*C30B 29/00* (2006.01)
*G01N 21/64* (2006.01)
*G01N 21/95* (2006.01)
*G01N 21/84* (2006.01)

(52) U.S. Cl.
CPC .......... *H01L 22/12* (2013.01); *C30B 29/00* (2013.01); *G01N 21/6489* (2013.01); *G01N 21/9501* (2013.01); *H01L 21/02378* (2013.01); *H01L 21/02529* (2013.01); *G01N 2021/8461* (2013.01); *G01N 2021/8477* (2013.01)

(58) Field of Classification Search
CPC ............ G01N 21/6489; G01N 21/9501; H01L 21/2033; H01L 21/2053
See application file for complete search history.

(56) References Cited

U.S. PATENT DOCUMENTS

| 2012/0161155 | A1* | 6/2012 | Harada | ............. C30B 23/00 257/77 |
| 2013/0320357 | A1 | 12/2013 | Aigo et al. | |
| 2017/0317174 | A1* | 11/2017 | Hiyoshi | ............. H01L 21/30625 |
| 2019/0376206 | A1* | 12/2019 | Fukada | ............. C30B 25/16 |

FOREIGN PATENT DOCUMENTS

| DE | 11 2016 004 194 T5 | 6/2018 |
| JP | 2007-318029 A | 12/2006 |
| JP | 2010-153464 A | 7/2010 |
| WO | 2012/144614 A1 | 10/2012 |
| WO | 2017/094764 A1 | 6/2017 |
| WO | 2017/104751 A1 | 6/2017 |

OTHER PUBLICATIONS

Communication dated Jun. 1, 2021, from the Japanese Patent Office in application No. 2017-234586.

* cited by examiner

*Primary Examiner* — Daniel Whalen
(74) *Attorney, Agent, or Firm* — Sughrue Mion, PLLC

(57) ABSTRACT

An evaluation method of a SiC epitaxial wafer includes: a first observation step of preparing a SiC epitaxial wafer having a high-concentration epitaxial layer having an impurity concentration of $1 \times 10^{18}$ cm$^{-3}$ or more, irradiating a surface of the high-concentration epitaxial layer having an impurity concentration of $1 \times 10^{18}$ cm$^{-3}$ or more with excitation light, and observing a surface irradiated with the excitation light via a band-pass filter having a wavelength band of 430 nm or less.

13 Claims, 8 Drawing Sheets (a) CONFOCAL MICROSCOPE (b) 660 nm BANDPASS FILTER (c) 420 nm BANDPASS FILTER

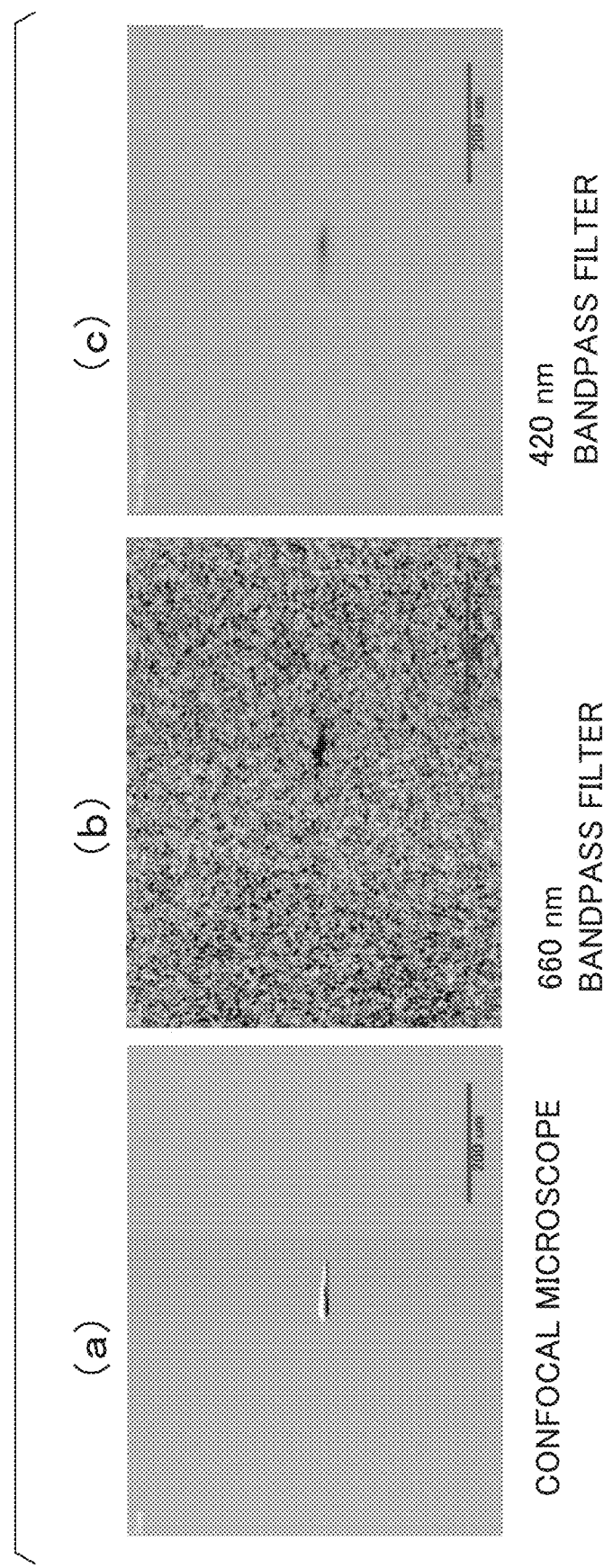

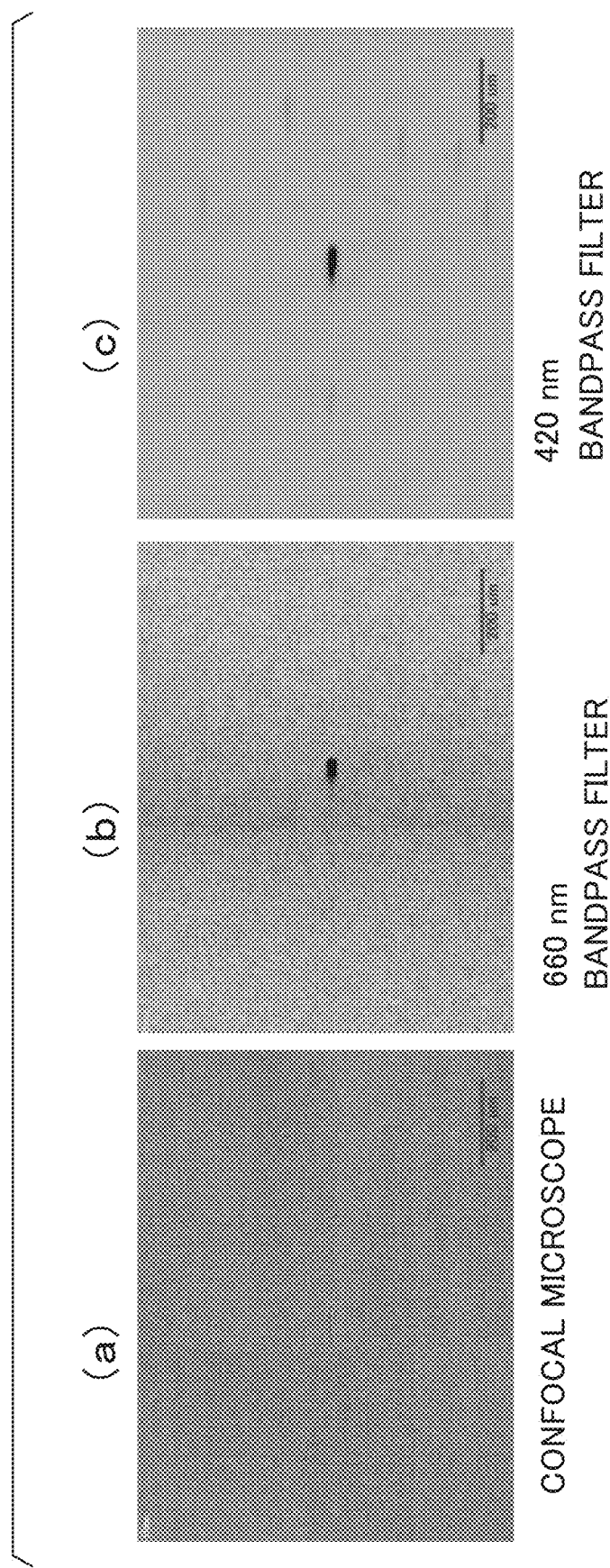

EVALUATION METHOD AND MANUFACTURING METHOD OF SIC EPITAXIAL WAFER

BACKGROUND OF THE INVENTION

Field of the Invention

The present invention relates to an evaluation method and a manufacturing method of a SiC epitaxial wafer.

Priority is claimed on Japanese Patent Application No. 2017-234586, filed on Dec. 6, 2017, the content of which is incorporated herein by reference.

Description of Related Art

Silicon carbide (SiC) has a dielectric breakdown field larger by one order of magnitude, a band gap three times larger, and a thermal conductivity approximately three times higher than those of silicon (Si). Therefore, application of silicon carbide (SiC) to power devices, high-frequency devices, high-temperature operation devices, and the like is expected.

In order to promote the practical application of SiC devices, establishment of high-quality SiC epitaxial wafers and high-quality epitaxial growth techniques is required.

A SiC device is formed on a SiC epitaxial wafer including a SiC substrate and an epitaxial layer stacked on the substrate. The SiC substrate can be obtained by processing a bulk single crystal of SiC grown by a sublimation recrystallization method or the like. The epitaxial layer is formed by a chemical vapor deposition (CVD) method and becomes an active region of the device.

More specifically, the epitaxial layer is formed on the SiC substrate having a plane with an off-angle in a <11-20> direction from a (0001) plane as a growth surface. The epitaxial layer undergoes step-flow growth (growth in a lateral direction from atomic steps) on the SiC substrate and becomes 4H-SiC.

In a SiC epitaxial wafer, as one of device killer defects that cause fatal defects in a SiC device, a basal plane dislocation (BPD) is known. For example, due to a recombination energy of minority carriers that flow when a forward current is applied to a bipolar device, the BPD succeeded by the epitaxial layer from the SiC substrate extends and becomes a high resistance stacking fault. In addition, when a high resistance portion is formed in the device, the reliability of the device is decreased. Therefore, a reduction in the BPD succeeded by the epitaxial layer has been carried out.

Most of BPDs in the SiC substrate can be converted into threading edge dislocations (TED) which do not cause defect extension when the epitaxial layer is formed. A conversion ratio of 99.9% or more can be realized at the present time, and device defects due to BPDs in the epitaxial layer can be almost ignored. On the other hand, it has been found that BPDs in the SiC substrate converted into TEDs form stacking faults in the epitaxial layer when a large current flows in a forward direction. Without suppressing this, even if the conversion ratio into TEDs is increased, it cannot be said that the device defects due to BPDs are completely eliminated. Therefore, as means for suppressing this, it is considered effective not to recombine minority carries in the vicinity of BPDs in the substrate.

In Patent Documents 1 and 2, it is described that by stacking an epitaxial layer doped with impurities at a high concentration on a SiC substrate, the probability of minority carries reaching BPDs in the substrate when a forward current is applied to a device can be suppressed, and formation of stacking faults which are highly resistive due to the extension can be prevented.

PRIOR ART DOCUMENTS

Patent Documents

Patent Document 1: PCT International Publication No. WO2017/094764

Patent Document 2: PCT International Publication No. WO2017/104751

SUMMARY OF THE INVENTION

Problems to be Solved by the Invention

BPDs in an epitaxial layer is generally identified by a photoluminescence method (PL method). For example, a SiC epitaxial wafer is irradiated with excitation light at 313 nm, and the irradiated surface is observed through a band-pass filter that passes a wavelength band of 660 nm or more. In a case where a BPD is present in the irradiated surface, the location emits light.

On the other hand, in a case where a high-concentration epitaxial layer is used, BPDs in the high-concentration epitaxial layer are invisible because light emission by the surrounding area becomes stronger than light emission by the BPDs in the wavelength band.

That is, BPDs present in a high-concentration epitaxial layer could not be identified.

By using a wafer in which a high-concentration epitaxial layer is stacked on the SiC substrate as described above, when a forward current is applied to a device in which conduction is caused by minority carriers, such as a bipolar device, it is possible to prevent BPDs from extending and becoming stacking faults which are highly resistive. However, from the viewpoint of quality control, there is a problem that BPDs that have not been converted into TEDs cannot be identified due to the high-concentration epitaxial layer.

The present invention has been made taking the foregoing problems into consideration, and an object thereof is to obtain an evaluation method and a manufacturing method of a SiC epitaxial wafer capable of evaluating a basal plane dislocation (BPD) in a high-concentration epitaxial layer.

Means for Solving the Problem

As a result of intensive investigations, the inventors found that when a surface irradiated with excitation light is observed via a band-pass filter having a wavelength band of 430 nm or less, BPDs look dark compared to the other regions. In the method in the related art, BPDs are identified by light emission, whereas BPDs are identified as dark lines in the present invention. A detection process of such BPDs is different and cannot be achieved by the idea of simply changing the wavelength band of the band-pass filter.

The present invention provides the following means in order to solve the above problems.

(1) According to a first aspect, an evaluation method of a SiC epitaxial wafer includes: a first observation step of preparing a SiC epitaxial wafer having a high-concentration epitaxial layer having an impurity concentration of $1\times10^{18}$ cm$^{-3}$ or more, irradiating a surface of the high-concentration epitaxial layer having an impurity concentration of $1\times10^{18}$ cm$^{-3}$ or more with excitation light, and observing a surface irradiated with the excitation light via a band-pass filter having a wavelength band of 430 nm or less.

The first aspect preferably includes the following features. The following features are preferably combined with each other.

(2) In the evaluation method of a SiC epitaxial wafer according to the aspect, in the first observation step, a defect which extends in an offset direction and has an aspect ratio of more than 1 may be observed.

(3) The evaluation method of a SiC epitaxial wafer according to the aspect may further include: a second observation step of observing the surface irradiated with the excitation light via a band-pass filter having a wavelength band of more than 430 nm; and a first determination step of comparing an observation result of the first observation step with an evaluation result of the second observation step.

(4) The evaluation method of a SiC epitaxial wafer according to the aspect may further include: a third observation step of performing surface observation on a surface which is the same as the surface irradiated with the excitation light and before being irradiated with the excitation light; and a second determination step of comparing an observation result of the first observation step with an evaluation result of the third observation step.

(5) In the evaluation method of a SiC epitaxial wafer according to the aspect, presence or absence and a position of a basal plane dislocation of the wafer may be detected in the first observation step.

(6) The evaluation method of a SiC epitaxial wafer according to the aspect may further include: a third determination step of comparing evaluation results of the first, second, and third observation steps, in which, in the third determination step, a defect which is observed only in the observation result of the first observation step is determined as a basal plane dislocation.

(7) In the evaluation method of a SiC epitaxial wafer according to the aspect, in the third determination step, a defect which is observed in all the first to third observation steps is determined as a prismatic stacking fault, and a defect which is observed only in the observation results of the first and second observation steps is determined as a basal plane stacking fault.

(8) According to a second aspect, a manufacturing method of a SiC epitaxial wafer includes steps of: stacking a high-concentration epitaxial layer having an impurity concentration of $1\times10^{18}$ cm$^{-3}$ or more on one surface of a SiC substrate; evaluating the high-concentration epitaxial layer using the evaluation method of a SiC epitaxial wafer according to the aforementioned aspect; and stacking a drift layer on the high-concentration epitaxial layer.

The second aspect preferably includes the following features. The following features are preferably combined with each other.

(9) The manufacturing method of a SiC epitaxial wafer according to the aspect may further include: a step of stacking a buffer layer having a lower impurity concentration than that of the high-concentration epitaxial layer between the SiC substrate and the high-concentration epitaxial layer.

(10) The manufacturing method of a SiC epitaxial wafer according to the aspect may further include: a step of determining whether or not the obtained result of the first observation step satisfies an acceptance criterion, after the aforementioned step of evaluating the high-concentration epitaxial layer, and, in the step of stacking the drift layer, the drift layer is stacked on the high-concentration epitaxial layer which satisfies the acceptance criterion.

Effects of Invention

With the evaluation method of a SiC epitaxial wafer according to the aspect, it is possible to evaluate a basal plane dislocation (BPD) in the high-concentration epitaxial layer.

BRIEF DESCRIPTION OF THE DRAWINGS

FIG. 7 is a view of a prismatic stacking fault observed at the same position, in which (a) is an image of the surface of the high-concentration epitaxial layer taken by the confocal microscope, (b) shows a result of observation of the surface irradiated with the excitation light via the band-pass filter having a wavelength band of 660 nm, and (c) shows a result of observation of the surface irradiated with the excitation light via the band-pass filter having a wavelength band of 420 nm.

FIG. 8 is a view of basal plane stacking faults observed at the same position, in which (a) is an image of the surface of the high-concentration epitaxial layer taken by the confocal microscope, (b) shows a result of observation of the surface irradiated with the excitation light via the band-pass filter having a wavelength band of 660 nm, and (c) shows a result of observation of the surface irradiated with the excitation light via the band-pass filter having a wavelength band of 420 nm.

DETAILED DESCRIPTION OF THE INVENTION

Figure 1:
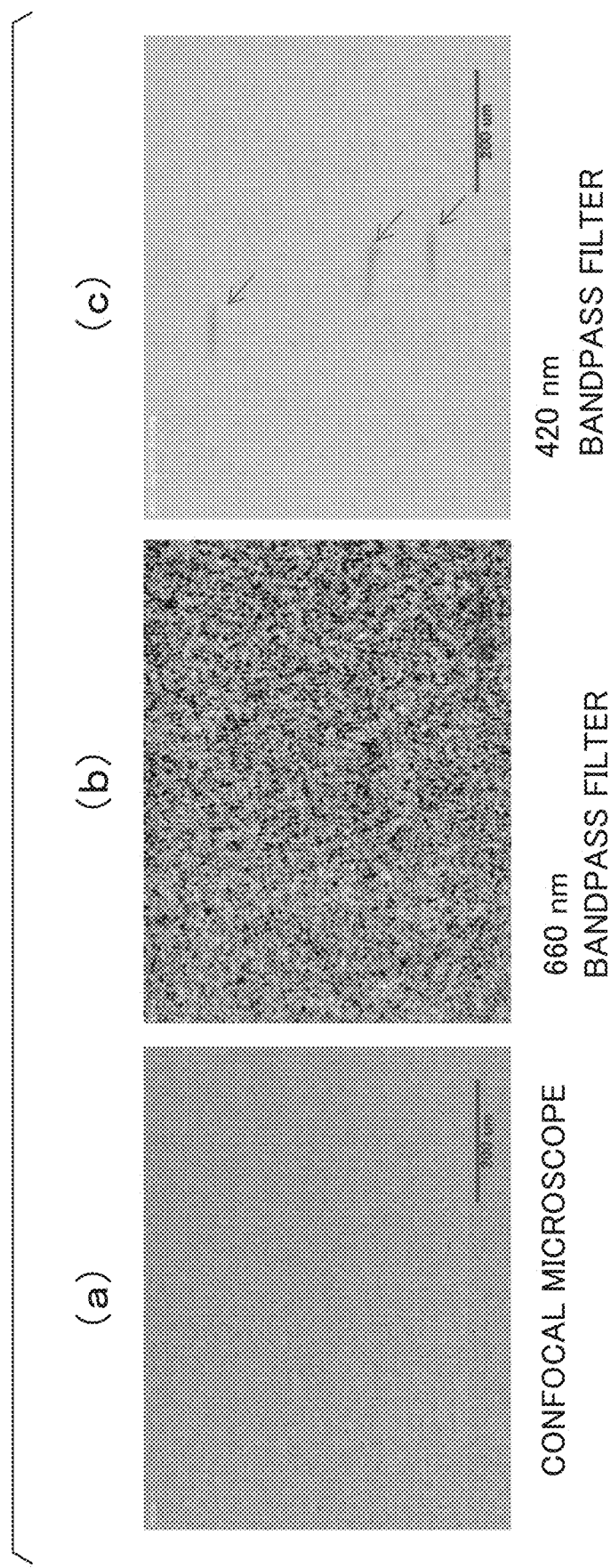
FIG. 1 is a view of a high-concentration epitaxial layer observed at the same position, in which (a) is an image of a surface of the high-concentration epitaxial layer taken by a confocal microscope, (b) shows a result of observation of the surface irradiated with the excitation light via a band-pass filter having a wavelength band of 660 nm, and (c) shows a result of observation of the surface irradiated with the excitation light via a band-pass filter having a wavelength band of 420 nm.

Hereinafter, an embodiment of the present invention will be described in detail with reference to the drawings as appropriate. In the drawings used in the following description, for ease of understanding of the features of the present invention, there are cases where characteristic portions are enlarged for convenience, and the dimension, the ratio and the like of each constituent element may be the same or may be different from reality. The materials, dimensions, and the like shown in the following description are merely examples, and the present invention is not limited thereto and can be embodied in appropriately modified manners in a range that does not change the gist thereof.

"Manufacturing Method of SiC Epitaxial Wafer"

A manufacturing method of a SiC epitaxial wafer according to the embodiment includes a step of stacking a high-concentration epitaxial layer having an impurity concentration of $1\times10^{18}$ cm$^{-3}$ or more on a SiC substrate, a step of evaluating the high-concentration epitaxial layer using a predetermined evaluation method of a SiC epitaxial wafer, and a step of stacking a drift layer on the high-concentration epitaxial layer.

(Step of Stacking High-Concentration Epitaxial Layer)

First, the SiC substrate is prepared. A method of preparing the SiC substrate is not particularly limited. For example, the SiC substrate can be obtained by slicing a SiC ingot obtained by a sublimation method or the like. In this specification, the SiC epitaxial wafer means a wafer after forming an epitaxial film, and the SiC substrate means a wafer before forming the epitaxial layer.

In the SiC substrate, BPDs are present along a (0001) plane (c plane). The number of BPDs exposed to a growth surface of the SiC substrate is preferably as small as possible, but is not particularly limited. At the current level of technology, the number of BPDs present on the surface (growth surface) of a 6-inch SiC substrate is about 500 to 5000 per 1 cm$^2$.

Next, the high-concentration epitaxial layer is epitaxially grown on the SiC substrate. As doping impurities, nitrogen, boron, titanium, vanadium, aluminum, gallium, phosphorus, or the like can be used. The high-concentration epitaxial layer is a layer formed by epitaxial growth, and is a layer having an impurity concentration of $1.0\times10^{18}$ cm$^{-3}$ or more. By stacking layer, in a case where a current is caused to flow in a forward direction of a bipolar device having BPDs, it is possible to prevent the minority carriers from reaching the BPDs. As a result, formation of Shockley type stacking faults and extension of the faults can be suppressed. That is, deterioration of characteristics of the device in the forward direction can be suppressed.

The thickness of the high-concentration epitaxial layer is preferably 0.1 μm or more, more preferably 1 μm or more, and even more preferably 3 μm or more.

In addition, a buffer layer having an impurity concentration equal to or lower than that of the high-concentration epitaxial layer may be stacked between the SiC substrate and the high-concentration epitaxial layer. The buffer layer is a layer for alleviating the difference in carrier concentration between the high-concentration epitaxial layer and the SiC substrate.

(Step of Evaluating High-Concentration Epitaxial Layer: First Observation Step)

Next, as a step of evaluating the high-concentration epitaxial layer (first observation step), it is evaluated whether or not BPDs are present in the high-concentration epitaxial layer. In the first observation step, the surface of the high-concentration epitaxial layer having an impurity concentration of $1\times10^{18}$ cm$^{-3}$ or more is irradiated with excitation light, and the surface irradiated with the excitation light is observed via a band-pass filter having a wavelength band of 430 nm or less.

A mercury lamp can be preferably used as a light source of the excitation light. The irradiation time can be selected as necessary, but is preferably 10 msec or more and 100 sec or less, and more preferably 200 msec or more and 10 sec or less. When the excitation light is sufficiently irradiated, the contrast between the BPD and the other regions becomes clear. However, "the enhanced background PL" occurs due to the excitation light in the meantime, which simultaneously causes a reduction in detection sensitivity. Therefore, it is preferable to suppress the intensity of the irradiated excitation light to a low level. Specifically, the intensity of the excitation light is preferably 1 Wcm$^{-2}$ or less, and more preferably 500 mWcm$^{-2}$ or less. The irradiated excitation light is preferably a wavelength of 280 nm or more and 375 nm or less. When not a laser but the mercury lamp is used, the intensity of the irradiated excitation light can be suppressed to a low level. In observation examples described below, the mercury lamp was used for irradiation.

FIG. 1 is a view of the high-concentration epitaxial layer having an impurity concentration of $1\times10^{18}$ cm$^{-3}$ or more in the SiC epitaxial wafer, which was observed. (a) shown in FIG. 1 is an image of a surface of the high-concentration epitaxial layer at a predetermined position taken by a confocal microscope, (b) shown in FIG. 1 shows a result of observation of the surface irradiated with the excitation light at the position via a band-pass filter having a wavelength band of 660 nm, and (c) shown in FIG. 1 shows a result of observation of the surface irradiated with the excitation light at the position via a band-pass filter having a wavelength band of 420 nm.

As shown in FIG. 1, in the case of the high-concentration epitaxial layer, even when the surface irradiated with the excitation light was observed via the band-pass filter having a wavelength band of 660 nm, BPDs were not identified. In addition, even when surface observation was performed by the confocal microscope, BPDs were not identified. Contrary to this, when the surface irradiated with the excitation light was observed via the band-pass filter having a wavelength band of 420 nm, BPDs were observed to be dark.

Figure 2:
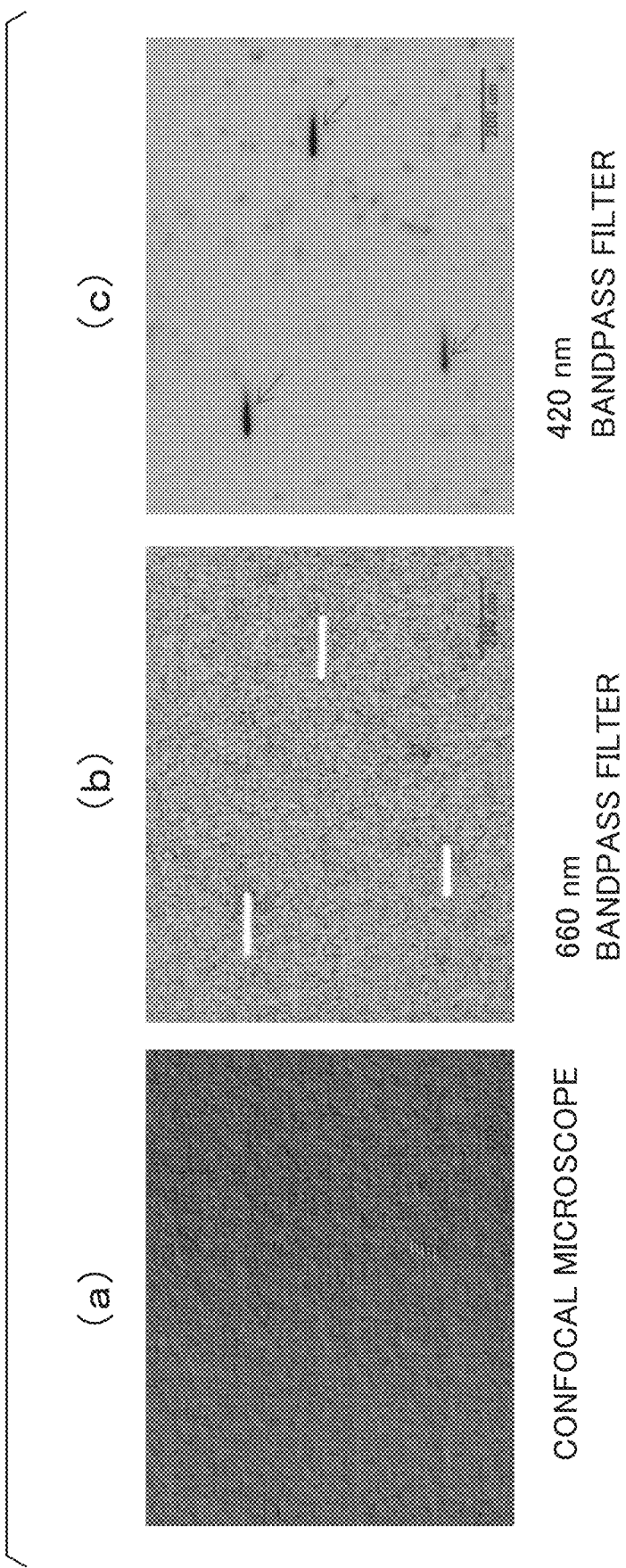
FIG. 2 is a view of an epitaxial layer having an impurity concentration of about $1\times10^{16}$ cm$^{-3}$, which is observed at the same position, in which (a) is an image of a surface of the high-concentration epitaxial layer taken by the confocal microscope, (b) shows a result of observation of the surface irradiated with the excitation light at the position via the band-pass filter having a wavelength band of 660 nm, and (c) shows a result of observation of the surface irradiated with the excitation light via the band-pass filter having a wavelength band of 420 nm.

On the other hand, FIG. 2 is a view of an epitaxial layer having an impurity concentration of $1\times10^{16}$ cm$^{-3}$ in the SiC epitaxial wafer, which was observed. (a) shown in FIG. 2 is an image of a surface of the high-concentration epitaxial layer at a predetermined position taken by the confocal microscope, (b) shown in FIG. 2 shows a result of observation of the surface irradiated with the excitation light at the position via the band-pass filter having a wavelength band of 660 nm, and (c) shown in FIG. 2 shows a result of observation of the surface irradiated with the excitation light at the position via the band-pass filter having a wavelength band of 420 nm.

As shown in FIG. 2, in the case of the epitaxial layer having an impurity concentration equivalent to that of the drift layer (about $1\times10^{16}$ cm$^{-3}$), when the surface irradiated with the excitation light was observed via the band-pass filter having a wavelength band of 660 nm, light emission by BPDs (photoluminescence light) was observed.

As shown in FIG. 2, even in the epitaxial layer having an impurity concentration of about $1\times10^{16}$ cm$^{-3}$, the surface irradiated with the excitation light was observed via the band-pass filter having a wavelength band of 420 nm.

Even in this case, BPDs were observed to be dark. That is, although the observation state of BPDs is different between light emission and absorption, it could be confirmed that BPDs were identified by the observation via the band-pass filter having a wavelength band of 420 nm. In addition, even in the layer, BPDs could not be identified by the confocal microscope.

Figure 3:
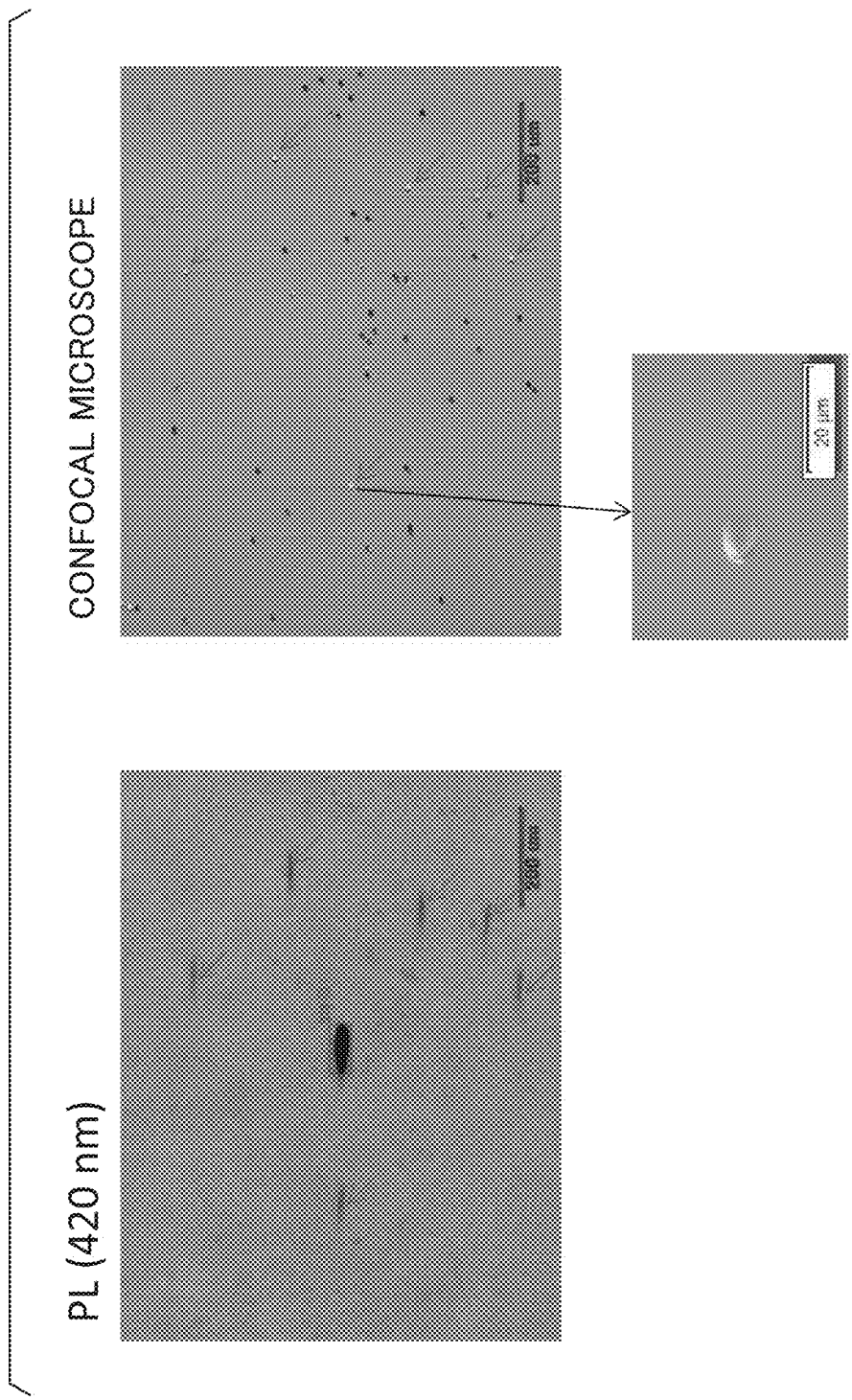
FIG. 3 is a view of comparison between a result of observation of the surface irradiated with the excitation light via the band-pass filter having a wavelength band of 420 nm and a result of surface observation by the confocal microscope after the surface of the high-concentration epitaxial layer was etched with KOH, at the same place.

FIG. 3 is a view of comparison between a result of observation of the surface irradiated with the excitation light via the band-pass filter having a wavelength band of 420 nm and a result of surface observation by the confocal microscope after the surface of the high-concentration epitaxial layer was etched with KOH, at the same place. When the epitaxial layer having BPDs is etched with KOH, pits are generated at places where BPDs are present. As shown in FIG. 3, the result of observation of the surface irradiated with the excitation light via the band-pass filter having a wavelength band of 420 nm and the result of observation of the surface of the high-concentration epitaxial layer which was etched with KOH and observed with the confocal microscope have a correspondence relationship. That is, from this viewpoint as well, it could be confirmed that BPDs were identified by the observation via the band-pass filter having a wavelength band of 420 nm.

In FIG. 1, BPDs were identified using the band-pass filter having a wavelength band of 420 nm. However, the band-pass filter used in the first observation step is not limited to the wavelength band, and a band-pass filter having a wavelength band of 430 nm or less can be used.

Figure 4:
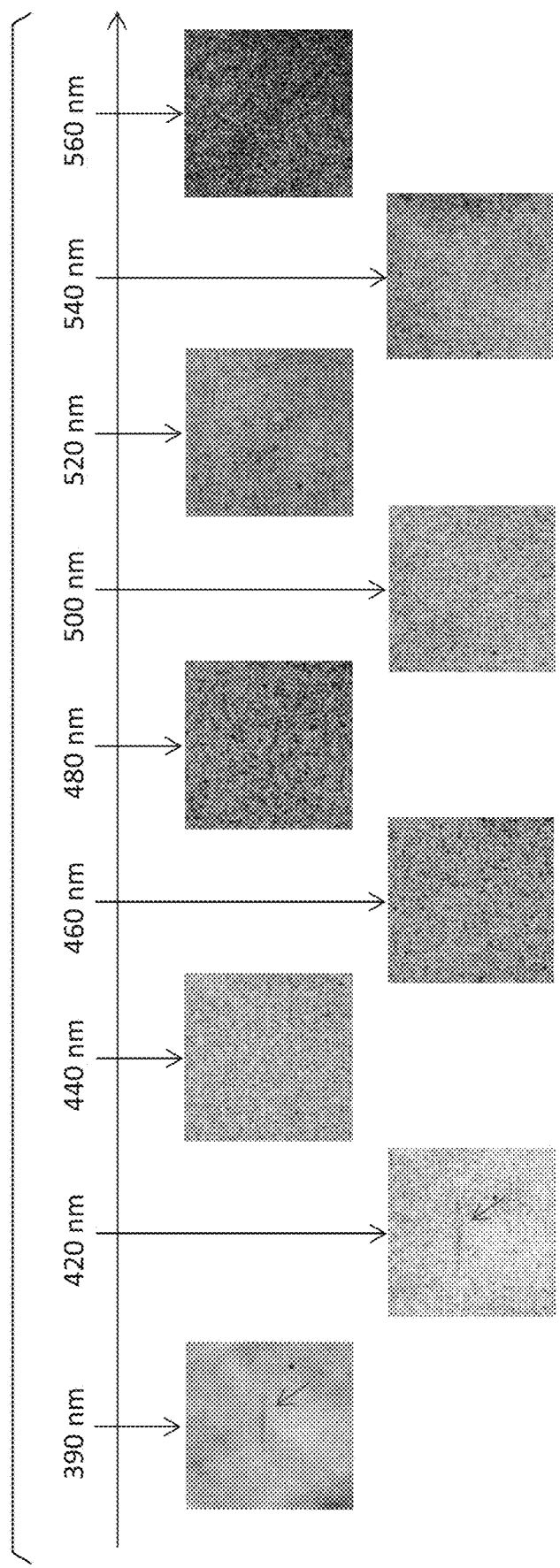
FIG. 4 is a view of a summary of results of observation of the surface irradiated with the excitation light at the same position by changing the wavelength band of the band-pass filter.

FIG. 4 is a view of a summary of results of observation of the surface irradiated with the excitation light in the SiC epitaxial wafer having the high-concentration epitaxial layer having an impurity concentration of $1 \times 10^{18}$ cm$^{-3}$ or more by changing the wavelength band of the band-pass filter. As shown in FIG. 4, when the band-pass filter having a wavelength band of 420 nm or less was used, BPDs could be identified. However, when the band-pass filter having a wavelength band of more than 420 nm was used, BPDs could not be identified. Here, a band-pass filter having a specific wavelength can pass light of a wavelength band of about ±10 nm of a specific wavelength. That is, when BPDs can be identified by the band-pass filter having a wavelength band of 420 nm, the BPDs can also be identified by the band-pass filter having a wavelength band of 430 nm. Therefore, in the first observation step, the band-pass filter having a wavelength band of a 430 nm or less can be used.

The impurity concentration of the high-concentration epitaxial layer is preferably $1 \times 10^{18}$ cm$^{-3}$ or more and $2 \times 10^{19}$ cm$^{-3}$ or less, and more preferably $1 \times 10^{19}$ cm$^{-3}$ or less. When the impurity concentration of the high-concentration epitaxial layer is too high, the probability of occurrence of defects other than BPDs increases.

Figure 5:
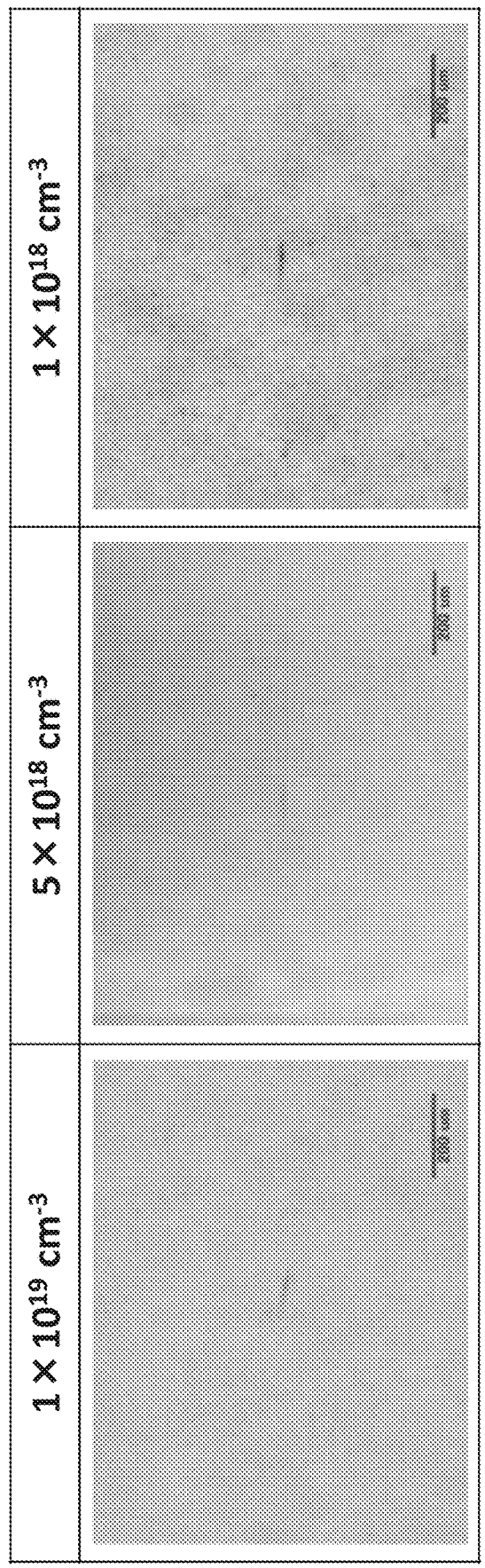
FIG. 5 is a view showing a result of observation of the surface irradiated with the excitation light via the band-pass filter having a wavelength band of 420 nm, which is a result of changing the impurity concentration of the high-concentration epitaxial layer.

FIG. 5 shows a result of observation of the surfaces irradiated with the excitation light via the band-pass filter having a wavelength band of 420 nm in the three SiC epitaxial wafers having the high-concentration epitaxial layer having an impurity concentration of $1 \times 10^{18}$ cm$^{-3}$ or more. Results of evaluation of the SiC epitaxial wafers having the high-concentration epitaxial layer with different impurity concentrations are shown. As shown in FIG. 5, BPDs can be identified by performing the first observation step at any impurity concentration of $1 \times 10^{18}$ cm$^{-3}$ to $1 \times 10^{19}$ cm$^{-3}$.

In the method, there may be cases where defects other than BPDs are identified. The object can be achieved when the presence or absence of BPDs can be determined. However, it is more preferable that the positions of the BPDs can be identified. Therefore, it is more preferable that BPDs can be distinguished from other defects.

One of discrimination methods is a discrimination using the shape of defects to be identified (first discrimination method).

A BPD is a dislocation present on a (0001) plane (c plane) which is the basal plane of a SiC substrate. In general, the SiC substrate has a surface having an offset angle in a <11-20> direction from (0001) as a growth surface. Therefore, BPDs extending in the offset direction are observed. That is, a BPD is a defect having a major axis with an inclination angle of 45° or less with respect to the <11-20> direction.

Therefore, it is preferable that a defect is discriminated by determining a defect that extends in the offset direction and has an aspect ratio larger than 1 as a BPD. Depending on the accuracy of discrimination of defects, the aspect ratio may be 1.5 or more, or may be 2.0 or more. Here, the aspect ratio is a value obtained by dividing the length of the major axis of a defect to be measured by the length of the minor axis thereof.

Figure 6:
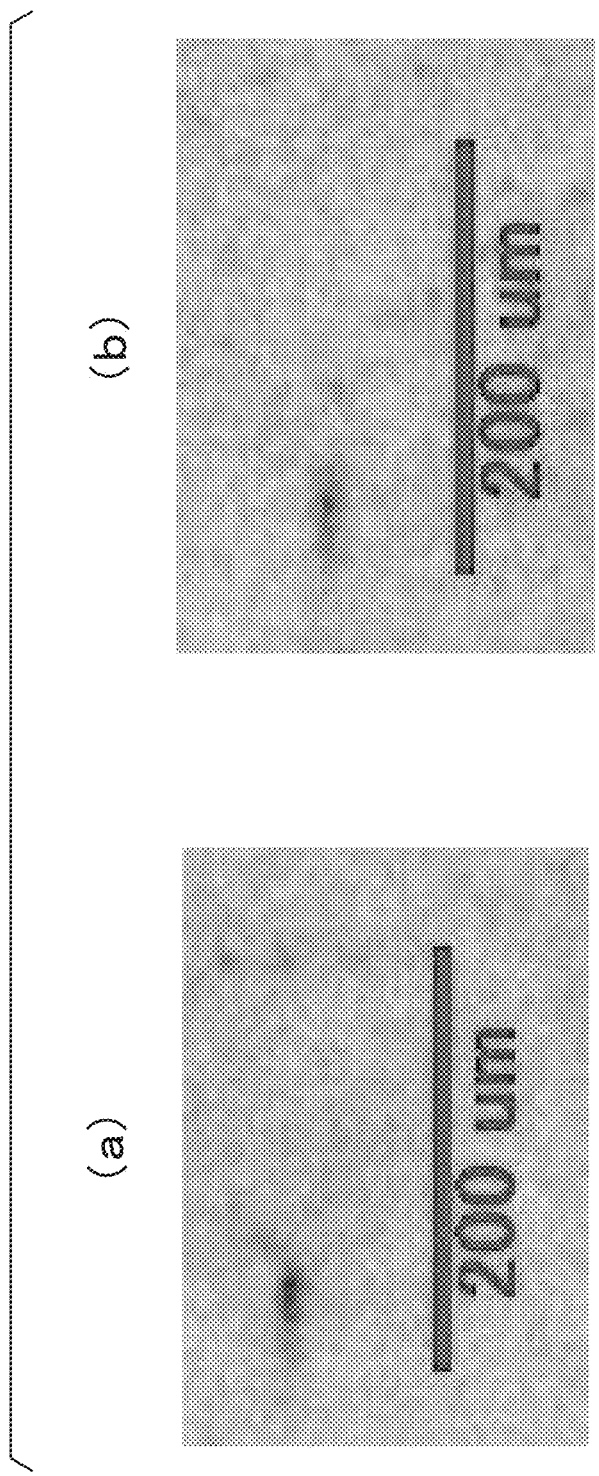
FIG. 6 is a view showing results of measurement of a BPD in a case of being converted into a TED in the epitaxial layer at two points in the first observation step.

As shown in FIG. 1, the aspect ratio in a case where a BPD succeeded by the epitaxial layer from the SiC substrate extends to the surface of the epitaxial layer is 2.0 or more. On the other hand, the aspect ratio in a case where the BPD is converted into a TED in the epitaxial layer is less than 2.0 in some cases. FIG. 6 shows results of measurement of a BPD in a case of being converted into a TED in the epitaxial layer in the first observation step. The aspect ratio of the BPD in (a) shown in FIG. 6 is 1.67, and the aspect ratio of the BPD in (b) shown in FIG. 6 is 1.85.

As another method of discriminating a BPD from other defects, there is a method of comparing the other evaluation results. For example, a second discrimination method further includes a second observation step of observing the surface irradiated with the excitation light via the band-pass filter having a wavelength band of 430 nm or more, and a first determination step of comparing the observation result of the first observation step with an evaluation result of the second observation step. Furthermore, for example, a third discrimination method further includes a third observation step of performing surface observation on a surface which is the same as the surface irradiated with the excitation light with a microscope or the like, and a second determination step of comparing the observation result of the first observation step with an evaluation result of the third observation step.

As a defect having a similar shape to a BPD, there are prismatic stacking faults (carrot defects), basal plane stacking faults, and the like. FIG. 7 is a view of a prismatic stacking fault which is observed. (a) shown in FIG. 7 is an image of the surface of the high-concentration epitaxial layer at a predetermined position taken by the confocal microscope, (b) shown in FIG. 7 shows a result of observation of the surface irradiated with the excitation light at the position via the band-pass filter having a wavelength band of 660 nm, and (c) shown in FIG. 7 shows a result of observation of the surface irradiated with the excitation light at the position via the band-pass filter having a wavelength band of 420 nm.

In addition, FIG. 8 is a view of observed basal plane stacking faults. (a) shown in FIG. 8 is an image of the surface of the high-concentration epitaxial layer at a predetermined position taken by the confocal microscope, (b) shown in FIG. 8 shows a result of observation of the surface irradiated with the excitation light at the position via the band-pass filter having a wavelength band of 660 nm, and (c) shown in FIG. 8 shows a result of observation of the surface irradiated with the excitation light at the position via the band-pass filter having a wavelength band of 420 nm.

As shown in FIG. 7, a prismatic stacking fault can be identified by the confocal microscope. In addition, in a case where the surface irradiated with the excitation light is observed via the band-pass filter having a wavelength band of 660 nm, the prismatic stacking fault does not emit light and appears dark. That is, by performing at least one of the second observation step and the third observation step and performing at least one of the first determination step and the second determination step, a prismatic stacking fault and a BPD can be distinguished from each other. That is, a BPD is not the one that can be confirmed by performing surface observation before irradiation without a band-pass filter or by using the band-pass filter having a wavelength band of 660 nm.

As shown in FIG. 8, a basal plane stacking fault cannot be identified by the confocal microscope.

On the other hand, in a case where the surface irradiated with the excitation light is observed via the band-pass filter having a wavelength band of 660 nm, the basal plane stacking fault does not emit light and appears dark. That is, a basal plane stacking fault can be distinguished by performing the second observation step and the first determination step.

A third determination step of comparing the evaluation results of the first, second, and third observation steps may be performed to determine a defect observed only in the observation result of the first observation step as a basal plane dislocation, determine a defect observed in all the first to third observation steps as a prismatic stacking fault, and determine a defect observed only in the observation results of the first and second observation steps as a basal plane stacking fault.

As described above, when the evaluation method of a SiC epitaxial wafer according to the embodiment is used, basal plane dislocations (BPDs) can be evaluated even in a case where the high-concentration epitaxial layer is stacked.

In addition, the BPDs measured by the evaluation method can be automatically detected using an image analysis software or can be counted quantitatively.

(Step of Stacking Drift Layer)

Finally, it is preferable that the drift layer is stacked on the high-concentration epitaxial layer. The drift layer is stacked by a known method. The impurity concentration of the drift layer is lower than that of the high-concentration epitaxial layer, and is below $1\times10^{17}$ cm$^{-3}$. The drift layer is a layer on which a SiC device is formed. When BPDs are included in the drift layer, the BPDs cause deterioration of the characteristics of the SiC device in the forward direction. In this regard, by converting the BPDs into TEDs at the interface between the substrate and the epitaxial layer, the number of BPDs included in the drift layer can be reduced. In addition, since the drift layer is stacked on the high-concentration epitaxial layer, deterioration of the characteristics due to the BPDs in the substrate is also suppressed.

In addition, in the step of evaluating the high-concentration epitaxial layer, predetermined acceptance criteria may be provided for the presence or absence of BPDs, the positions of BPDs and/or the number of BPDs regarding the BPDs present in the high-concentration epitaxial layer. For example, a step of determining whether or not the result of the first observation step satisfies a predetermined acceptance criterion may be provided to stack the drift layer only on the high-concentration epitaxial layer that satisfies the acceptance criterion. Alternatively, in a case where the predetermined acceptance criterion is not satisfied, an additional step of compensating for the criterion that has not been satisfied may be performed and thereafter the drift layer may be stacked.

As described above, according to the manufacturing method of a SiC epitaxial wafer according to the embodiment, it is possible to suppress BPDs from causing deterioration of the characteristics of the device. In addition, despite having the high-concentration epitaxial layer, the presence or absence and positions of BPDs can be identified, so that quality control of the SiC epitaxial wafer can be easily performed.

According to the present invention, it is possible to obtain an excellent evaluation method and a manufacturing method of a SiC epitaxial wafer capable of evaluating a basal plane dislocation (BPDs) in a high-concentration epitaxial layer.

While preferred embodiments of the invention have been described and illustrated above, it should be understood that these are exemplary of the invention and are not to be considered as limiting. Accordingly, the invention is not to be considered as being limited by the foregoing description, and is only limited by the scope of the appended claims.

The invention claimed is:

1. An evaluation method of a SiC epitaxial wafer comprising:
    a first observation step of
        preparing a SiC epitaxial wafer having a high-concentration epitaxial layer having an impurity concentration of $1\times10^{18}$ cm$^{-3}$ or more,
        irradiating a surface of the high-concentration epitaxial layer having the impurity concentration of $1\times10^{18}$ cm$^{-3}$ or more with excitation light, and
        observing via a band-pass filter having a wavelength band of 430 nm or less the surface irradiated with the excitation light,
    a second observation step of observing via a band-pass filter having a wavelength band of more than 430 nm the surface irradiated with the excitation light; and
    a determination step of comparing an observation result of the first observation step with an evaluation result of the second observation step.

2. The evaluation method of a SiC epitaxial wafer according to claim 1,
    wherein the SiC epitaxial wafer includes a SiC substrate and the epitaxial layer stacked on the substrate, and
    presence or absence and a position of a basal plane dislocation of the wafer are detected in the first observation step.

3. The evaluation method of a SiC epitaxial wafer according to claim 1, further comprising:
    a third observation step of performing surface observation on a surface which is the same as the surface irradiated with the excitation light and before being irradiated with the excitation light; and
    a third determination step of comparing evaluation results of the first, second, and third observation steps,
    wherein, in the third determination step, a defect which is observed only in the observation result of the first observation step is determined as a basal plane dislocation.

4. The evaluation method of a SiC epitaxial wafer according to claim 3,
    wherein, in the third determination step, a defect which is observed in all the first to third observation steps is determined as a prismatic stacking fault, and a defect which is observed only in the observation results of the first and second observation steps is determined as a basal plane stacking fault.

5. The evaluation method of a SiC epitaxial wafer according to claim 1,
wherein a observed defect observed as a basal plane dislocation appears dark compared to the other regions of the surface.

6. The evaluation method of a SiC epitaxial wafer according to claim 1,
wherein, among defects which are observed in the first observation step, a defect which has an aspect ratio larger than 1 and has a major axis with an inclination angle of 45° or less with respect to a <11-20> direction is discriminated as a basal plane dislocation, and
the aspect ratio is a value obtained by dividing a length of the major axis of the defect by a length of a minor axis of the defect.

7. An evaluation method of a SiC epitaxial wafer comprising:
a first observation step of
preparing a SiC epitaxial wafer having a high-concentration epitaxial layer having an impurity concentration of $1 \times 10^{18}$ cm$^{-3}$ or more,
irradiating a surface of the high-concentration epitaxial layer having the impurity concentration of $1 \times 10^{18}$ cm$^{-3}$ or more with excitation light, and
observing via a band-pass filter having a wavelength band of 430 nm or less the surface irradiated with the excitation light,
a third observation step of performing surface observation on a surface which is the same as the surface irradiated with the excitation light and before being irradiated with the excitation light; and
a determination step of comparing an observation result of the first observation step with an evaluation result of the third observation step.

8. A manufacturing method of a SiC epitaxial wafer comprising steps of:
stacking a high-concentration epitaxial layer having an impurity concentration of $1 \times 10^{18}$ cm$^{-3}$ or more on one surface of a SiC substrate;
irradiating a surface of the high-concentration epitaxial layer having the impurity concentration of $1 \times 10^{18}$ cm$^{-3}$ or more with excitation light,
observing via a band-pass filter having a wavelength band of 430 nm or less the surface irradiated with the excitation light, wherein the observing step is referred to as a first observation step,
observing via a band-pass filter having a wavelength band of more than 430 nm the surface irradiated with the excitation light, wherein the observing step is referred to as a second observation step: and comparing an observation result of the first observation step with an evaluation result of the second observation step to perform a determination; and
stacking a drift layer on the high-concentration epitaxial layer.

9. The manufacturing method of a SiC epitaxial wafer according to claim 8, further comprising:
a step of stacking a buffer layer having a lower impurity concentration than that of the high-concentration epitaxial layer between the SiC substrate and the high-concentration epitaxial layer.

10. The manufacturing method of a SiC epitaxial wafer according to claim 8, further comprising:
a step of determining whether or not the obtained result of the first observation step satisfies an acceptance criterion, after the step of evaluating the high-concentration epitaxial layer,
wherein, in the step of stacking the drift layer, the drift layer is stacked on the high-concentration epitaxial layer which satisfies the acceptance criterion.

11. The manufacturing method of a SiC epitaxial wafer according to claim 8,
wherein an observed defect observed as a basal plane dislocation appears dark compared to the other regions of the surface.

12. A manufacturing method of a SiC epitaxial wafer comprising steps of:
stacking a high-concentration epitaxial layer having an impurity concentration of $1 \times 10^{18}$ cm$^{-3}$ or more on one surface of a SiC substrate;
irradiating a surface of the high-concentration epitaxial layer having the impurity concentration of $1 \times 10^{18}$ cm$^{-3}$ or more with excitation light,
observing via a band-pass filter having a wavelength band of 430 nm or less the surface irradiated with the excitation light, wherein the observing step is referred to as a first observation,
performing surface observation on a surface which is the same as the surface irradiated with the excitation light and before being irradiated with the excitation light, wherein the step is referred to as a third observation; and
comparing an observation result of the first observation step with an evaluation result of the third observation step to perform a determination; and
stacking a drift layer on the high-concentration epitaxial layer.

13. The manufacturing method of a SiC epitaxial wafer according to claim 12, further comprising a step of determining whether or not the obtained result of the first observation step satisfies an acceptance criterion, and
wherein, in the step of stacking the drift layer, the drift layer is stacked on the high-concentration epitaxial layer which satisfies the acceptance criterion.

* * * * *